United States Patent
Cheng et al.

(10) Patent No.: US 10,303,278 B2
(45) Date of Patent: May 28, 2019

(54) TOUCH PANEL

(71) Applicant: AU OPTRONICS CORPORATION, Hsin-chu (TW)

(72) Inventors: Tsun-Chien Cheng, Hsin-chu (TW); Chun-Ku Kuo, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/801,110

(22) Filed: Nov. 1, 2017

(65) Prior Publication Data

US 2018/0120999 A1    May 3, 2018

(30) Foreign Application Priority Data

Nov. 2, 2016  (TW) .............................. 105135557 A

(51) Int. Cl.
  *H01L 27/32* (2006.01)
  *G06F 3/041* (2006.01)
  *G06F 3/044* (2006.01)

(52) U.S. Cl.
  CPC ............ *G06F 3/0412* (2013.01); *G06F 3/044* (2013.01); *H01L 27/322* (2013.01); *G06F 2203/04111* (2013.01)

(58) Field of Classification Search
  CPC ............................. G06F 3/044; H01L 27/322
  See application file for complete search history.

(56) References Cited

U.S. PATENT DOCUMENTS

| 2013/0100073 A1 | 4/2013 | Wang et al. |
| 2015/0021781 A1 | 1/2015 | Nishikawa et al. |
| 2016/0282983 A1* | 9/2016 | Chang ................. G06F 3/044 |
| 2018/0061898 A1* | 3/2018 | Oh ....................... H01L 27/322 |

FOREIGN PATENT DOCUMENTS

| CN | 103309480 A | 9/2013 |
| TW | M419163 U | 12/2011 |

OTHER PUBLICATIONS

Office Action issued by the State Intellectual Property Office of the Peoples Republic of China dated Feb. 26, 2019 for Application No. CN201611120418.1.

* cited by examiner

*Primary Examiner* — Abdul-Samad A Adediran
(74) *Attorney, Agent, or Firm* — Tim Tingkang Xia, Esq.; Locke Lord LLP

(57) ABSTRACT

A touch panel includes a substrate, a first sensing series, a second sensing series, and an insulating layer. The first sensing series, disposed on the substrate along a first direction, includes first sensing pads and at least one first bridge structure. The first bridge structure is connected between two adjacent first sensing pads, and has a first opening. The second sensing series, disposed on the substrate along a second direction different from the first direction, includes second sensing pads and at least one second bridge structure. The second bridge structure crosses the first bridge structure, and is connected between two adjacent second sensing pads. A portion of the second bridge structure is located in the first opening. The insulating layer is disposed between the first bridge structure and the second bridge structure. A portion of the insulating layer extending into the first opening has a second opening.

10 Claims, 7 Drawing Sheets

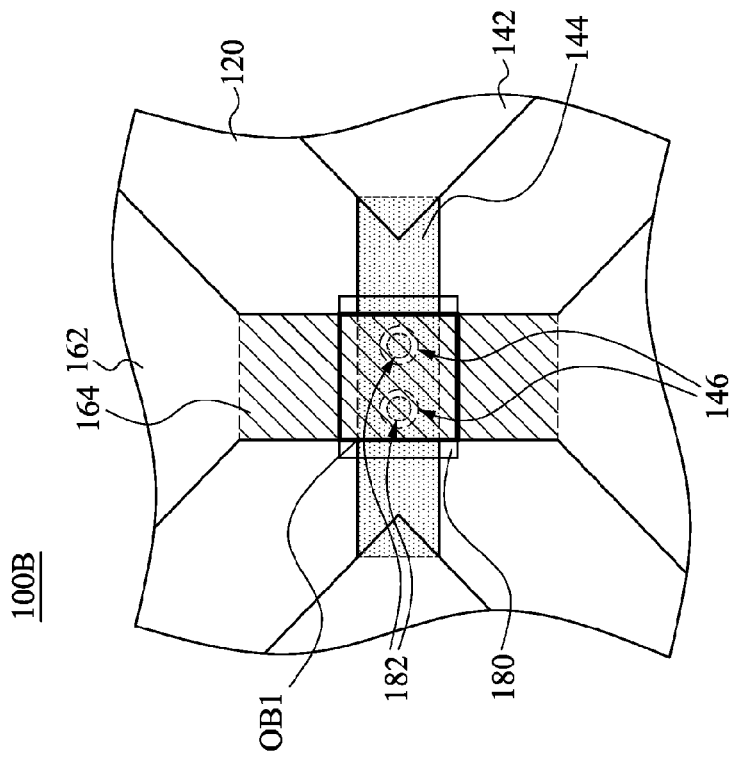
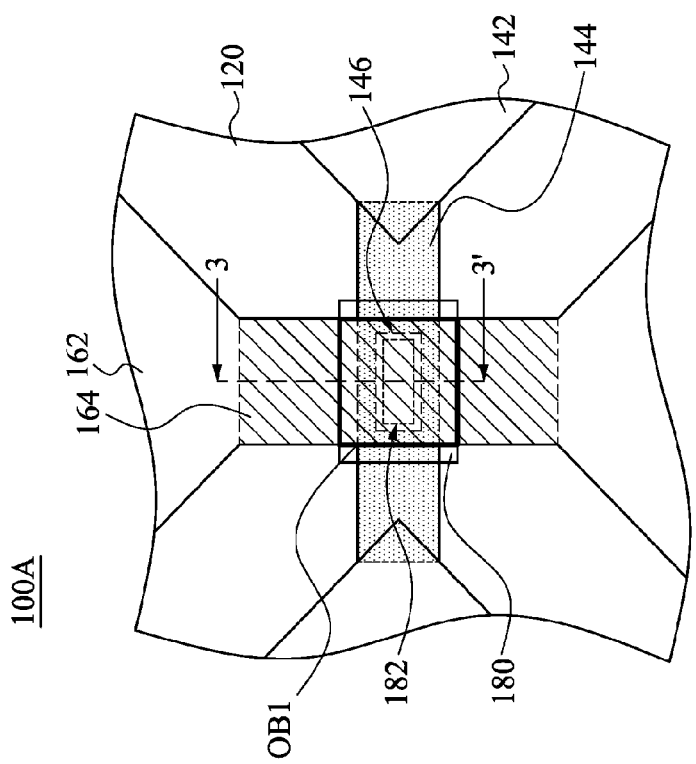

TOUCH PANEL

CROSS-REFERENCE TO RELATED PATENT APPLICATION

This application claims priority to and the benefit of, pursuant to 35 U.S.C. § 119(a), patent application Serial No. 105135557 filed in Taiwan on Nov. 2, 2016. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to a touch panel, and in particular, to a bridge structure of a touch panel.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

To manufacture a lighter and thinner touch display device, a touch panel in the touch display device is further integrated on a display panel. A decrease in thickness of a bridge structure can effectively improve a factory's production capacity of manufacturing the touch panel. However, the decrease in thickness of the bridge structure results in a corresponding increase in the reflectivity of the bridge structure. Therefore, the reflectivity of an intersection of bridge structures of different directions is greater than the reflectivity of a remaining portion of a touch panel, and the intersection is more visually obvious. Even more, when a reflectivity difference is relatively large, the bridge structures result in bright spots in matrix arrangement, and reduce the imaging quality and imaging effect, thereby restricting the performance of the touch display device. Hence, it is obvious that the foregoing existing touch panel still involves inconveniences and defects, and therefore needs to be further improved. To resolve the foregoing problem, the related art has painstakingly tried to seek a solution for a long time, but no applicable manner has been developed. Therefore, how to effectively resolve the foregoing problem is one of the current important research and development issues, and has become an urgent purpose in the related art.

SUMMARY

One technical aspect of the present invention relates to a touch panel, in which layers of an overlapping portion of a first bridge structure, a second bridge structure, and an insulating layer are respectively provided with openings corresponding to each other, and therefore, the reflectivity of the overlapping portion per unit area is decreased, a difference between the reflectivity of the overlapping portion and the reflectivity of a remaining portion of the touch panel is decreased, thereby enabling a visual effect of the overlapping portion to be relatively not obtrusive as compared with a visual effect of the remaining portion of the touch panel. Besides, a method of forming openings is used to decrease the reflectivity, so that first sensing pads and second sensing pads in the present invention can still transfer electrical signals through the first bridge structure and the second bridge structure respectively. In this way, the touch panel has a better visual effect without affecting transference paths of electrical signals of the first sensing pads and the second sensing pads, and the overlapping portion is prevented from being obtrusive caused by the reflectivity difference, thereby reducing or preventing a relatively poor visual effect generated at the overlapping portion of the first bridge structure, the second bridge structure, and the insulating layer.

The present invention provides a touch panel. The touch panel comprises a substrate, a first sensing series, a second sensing series, and at least one insulating layer. The first sensing series is disposed on the substrate along a first direction. The first sensing series comprises a plurality of first sensing pads and at least one first bridge structure. The first bridge structure is connected between any two adjacent first sensing pads, and the first bridge structure has at least one first opening. The second sensing series is disposed on the substrate along a second direction different from the first direction. The second sensing series comprises a plurality of second sensing pads and at least one second bridge structure. The second bridge structure is connected between any two adjacent second sensing pads, and crosses the first bridge structure. A portion of the second bridge structure is located in the first opening of the first bridge structure. The insulating layer is disposed between the first bridge structure and the second bridge structure, wherein a portion of the insulating layer extending into the first opening has at least one second opening.

In one or more embodiments of the present invention, an area of a vertical projection of the first opening on the substrate is greater than an area of a vertical projection of the second opening along a vertical direction to the substrate.

In one or more embodiments of the present invention, a thickness of each of the first sensing pads, a thickness of each of the second sensing pads, and a thickness of the second bridge structure are substantially the same.

In one or more embodiments of the present invention, the thickness of the second bridge structure may be greater than a thickness of the first bridge structure.

In one or more embodiments of the present invention, the thickness of the first bridge structure is between 300 Å and 900 Å.

In one or more embodiments of the present invention, the thickness of the second bridge structure is between 1000 Å and 1600 Å.

In one or more embodiments of the present invention, the portion of the second bridge structure located in the first opening covers the second opening.

In one or more embodiments of the present invention, a vertical projection of the second bridge structure and the insulating layer on the substrate along a vertical direction to the substrate is a first overlapping projection. An actual ratio of an area of a vertical projection of the second opening on the substrate to an area of the first overlapping projection along the vertical direction is greater than or equal to 50%.

In one or more embodiments of the present invention, the first bridge structure and the insulating layer are not provided between the portion of the second bridge structure located in the second opening and the substrate.

In one or more embodiments of the present invention, the portion of the second bridge structure located in the first opening covers the second opening and has at least one third opening. An area of a vertical projection of the second opening on the substrate along a vertical direction to the substrate is greater than an area of a vertical projection of the third opening.

In one or more embodiments of the present invention, a vertical projection of the second bridge structure and the insulating layer on the substrate along the vertical direction to the substrate is a second overlapping projection. An actual ratio of the area of the vertical projection of the third opening on the substrate to an area of the second overlapping projection along the vertical direction is greater than or equal to 32.5%.

In one or more embodiments of the present invention, the first bridge structure comprises at least one fourth opening. The fourth opening is located at a portion between the first sensing pads and an overlapping portion of the first bridge structure and the second bridge structure.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 2A is a top perspective view of a portion of the touch panel according to the embodiment of the present invention;

FIG. 2B is a top perspective view of a portion of a touch panel according to another embodiment of the present invention;

Unless otherwise denoted, a same number or symbol in different drawings is generally regarded as a corresponding component. The drawings are intended to clearly show association between the embodiments, and are not intended to show actual dimensions.

DETAILED DESCRIPTION

Figure 1:
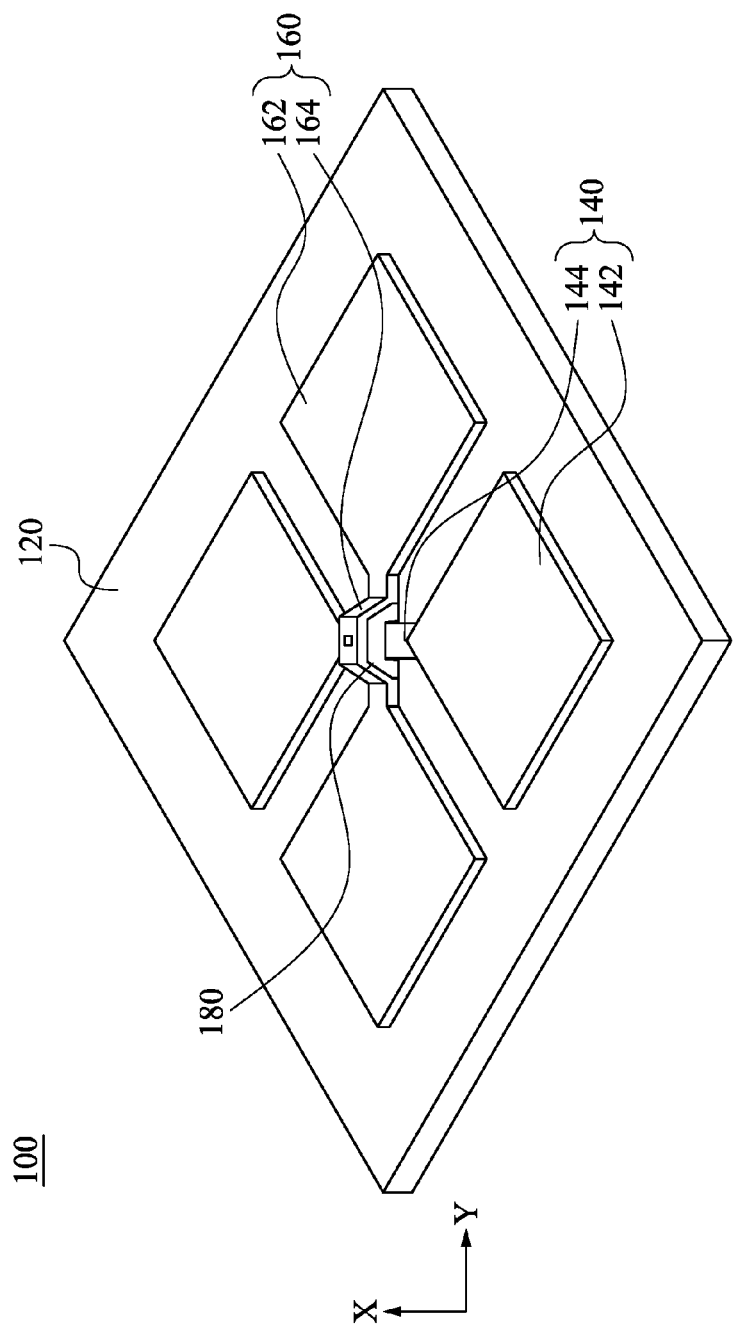
FIG. 1 is a three-dimensional schematic diagram of a touch panel according to an embodiment of the present invention.

A plurality of embodiments of the present invention is disclosed below with reference to drawings. To clarify the description, many practical details are described in the following description. However, it should be understood that these practical details are not intended to limit the present invention. That is, in some embodiments of the present invention, the practical details are not necessary. In addition, to simplify the drawings, some conventional structures and components are schematically illustrated in the drawings.

In this specification, it may be understood that terms such as first, second, and third are used to describe various elements, components, regions, layers, and/or blocks. However, these elements, components, regions, layers, and/or blocks are not limited to these terms. These terms are merely used to distinguish a unique element, component, region, layer and/or block. Therefore, a first element, component, region, layer and/or block below may be referred to as a second element, component, region, layer and/or block without departing from an original intention of the present invention.

Figure 3:
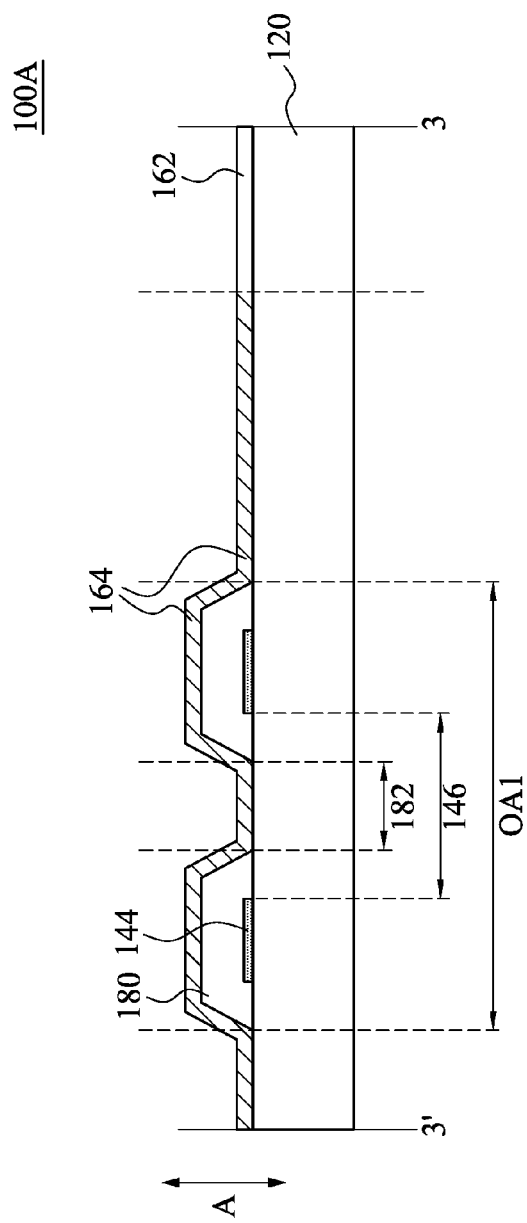
FIG. 3 is a cross-sectional view of the touch panel according to FIG. 2A taking along a line 3-3'.

FIG. 1 is a three-dimensional schematic diagram of a touch panel 100 according to an embodiment of the present invention. FIG. 2A is a top perspective view of a portion of the touch panel 100A according to the embodiment of the present invention, where a portion with a pattern of dots and a portion with a pattern of oblique lines may separately represent a first bridge structure 144 and a second bridge structure 164. FIG. 3 is a cross-sectional view of the touch panel 100A according to FIG. 2A taking along a line 3-3'. As shown in FIG. 1, the touch panel 100 includes a substrate 120, a first sensing series 140, a second sensing series 160, and an insulating layer 180. In this embodiment, the first sensing series 140 is disposed on the substrate 120 along a first direction X. The first sensing series 140 may include a plurality of first sensing pads 142 and a plurality of first bridge structures 144. A first bridge structure 144 is connected between any two adjacent first sensing pads 142. In this embodiment, the first bridge structure 144 may have at least one first opening 146, located at an intersecting and overlapping position of the first bridge structure 144 and the second bridge structure 164, referring to a scope framed by a large dashed box in FIG. 2A, and the first opening 146 in FIG. 3. In this embodiment, the second sensing series 160 is disposed on the substrate 120 along a second direction Y different from the first direction X. The second sensing series 160 includes a plurality of second sensing pads 162 and a plurality of second bridge structures 164. A second bridge structure 164 is connected between any two adjacent second sensing pads 162, and crosses a first bridge structure 144 and therefore intersects and overlaps the first bridge structure 144. Referring to FIG. 1, FIG. 2A, and FIG. 3, the insulating layer 180 is disposed between the first bridge structure 144 and the second bridge structure 164, and partially extends into the first opening 146. A portion, extending into the first opening 146, of the insulating layer 180 has at least one second opening 182 (for example, a scope framed by a small dashed box in FIG. 2A, and referring to FIG. 3). Subsequently, as shown in FIG. 2A, in the touch panel 100A, a portion of the second bridge structure 164 is located above the first bridge structure 144 and the insulating layer 180. In this embodiment, a portion of the second bridge structure 164 may extend into the second opening 182. That is, the second opening 182 may have a portion of the second bridge structure 164, but does not have the first bridge structure 144 and the insulating layer 180.

It should be noted that shapes of the insulating layer 180 and the second opening 182 shown in FIG. 1 and FIG. 2A are merely used as examples, and are not intended to limit the present invention. For example, in another embodiment, the second opening 182 may be a circle or another appropriate shape, and is not limited to a shape similar to the shape of the first opening 146. It should be understood that a person of ordinary skill in the art may make appropriate modifications or replacements according to actual requirements without departing from the spirit and scope of this disclosure, as long as the insulating layer 180 can insulate the first bridge structure 144 from the second bridge structure 164, and the second opening 182 is located in the first opening 146.

The first opening 146 of the first bridge structure 144 and the second opening 182 of the insulating layer 180 are located at an overlapping portion of the first bridge structure 144, the insulating layer 180, and the second bridge structure 164. Therefore, the average reflectivity of the overlapping portion per unit area may be decreased with decreases in coverage areas of the first bridge structure 144 and the insulating layer 180, thereby decreasing a difference between the reflectivity of the overlapping portion and that of a remaining non-overlapping portion of the adjacent second bridge structure 164 or the reflectivity of the second sensing pads 162 or the first sensing pads 142. In this way, when light separately passes through the overlapping portion of the first bridge structure 144, the insulating layer 180, and the second bridge structure 164 and the remaining non-overlapping portion of the touch panel 100A, the reflectivity of the overlapping portion is relatively close to the reflectivity of the remaining non-overlapping portion, so that the overlapping portion is prevented from being visually obvious on the touch panel 100A, thereby reducing or preventing visual obtrusiveness on the touch panel 100A caused by the overlapping portion.

FIG. 2B is a top perspective view of a portion of a touch panel 100B according to another embodiment of the present invention, where a portion with a pattern of dots and a portion with a pattern of oblique lines may separately represent the first bridge structure 144 and the second bridge structure 164. As shown in FIG. 2B, in this embodiment, the first bridge structure 144 of the touch panel 100B may include a plurality of first openings 146 (for example, two first openings shown in FIG. 2B). In this embodiment, the insulating layer 180 may include a plurality of second openings 182 (for example, two second openings shown in FIG. 2B), which are separately located within the aforementioned first openings 146. Besides, it can be known by further referring to FIG. 2A that shapes of the first openings 146 and the second openings 182 may be squares or circles, but the present invention is not limited thereto. In the touch panel 100B of FIG. 2B, the first bridge structure 144 extends between the two first openings 146, and therefore, an area of the first bridge structure 144 for transferring electrical signals can be increased, and resistance of the first bridge structure 144 is decreased, thereby enabling electrical signals transferred through the first bridge structure 144 to be more sensitive.

As shown in FIG. 3, in this embodiment, a thickness of the first bridge structure 144 may be less than a thickness of the second bridge structure 164. In this embodiment, the thickness of the first bridge structure 144 is between 300 Å and 900 Å. In another embodiment, the thickness of the first bridge structure 144 is between 200 Å and 800 Å. In this embodiment, the thickness of the second bridge structure 164 is between 1000 Å and 1600 Å. In another embodiment, the thickness of the second bridge structure 164 is between 1300 Å and 1500 Å. The thickness of the first bridge structure 144 of the touch panel 100A is less than the thickness of the second bridge structure 164, and therefore, as compared with another touch panel in which a thickness of a first bridge structure is the same as a thickness of a second bridge structure, the thickness of the first bridge structure 144 in the touch panel 100A can be decreased, so that the touch panel 100A can be manufactured with less material and a factory's production capacity of manufacturing the touch panel 100A can be improved.

Referring to FIG. 1 and FIG. 3, in this embodiment, a thickness of each first sensing pad 142, a thickness of each second sensing pad 162, and the thickness of each second bridge structure 164 may be substantially the same. In this embodiment, in a process of manufacturing the touch panel 100, the first sensing pads 142, the second sensing pads 162, and the second bridge structures 164 can be formed in a single process. In this way, the time required for manufacturing the touch panel 100 can be reduced. Besides, in this embodiment, the manufacturing process of the touch panel 100 may include first forming the first bridge structures 144, and then forming the first sensing pads 142, the second sensing pads 162, and the second bridge structures 164.

Besides, in this embodiment, the portion, located in the second opening 182, of the second bridge structure 164 can be in direct contact with the substrate 120, so as to support the second bridge structure 164 by means of the substrate 120, in other words, the insulating layer 180 and the first bridge structure 144 are not provided between the portion, located in the second opening 182, of the second bridge structure 164 and the substrate 120.

Referring to FIG. 2A and FIG. 3, in this embodiment, a vertical projection of the second bridge structure 164 and the insulating layer 180 on the substrate 120 along a direction A vertical to the substrate 120 may overlap a first overlapping projection OA1. That is, as shown in FIG. 2A, a portion, overlapping a portion of the second bridge structure 164 with the pattern of oblique lines, of the insulating layer 180 is the first overlapping projection OA1 of FIG. 3. An actual ratio of an area of a vertical projection of the second opening 182 on the substrate 120 along the direction A to an area framed by an outer edge OB1 (referring to a bold line box of FIG. 2A) of the first overlapping projection OA1 is greater than or equal to a first specific ratio. For example, when the thickness of the first bridge structure 144 is 550 Å, and the thickness of the second bridge structure 164 is 1500 Å, the first specific ratio may be about 50%, but the present invention is not limited thereto, as described below in detail.

It should be noted that the first specific ratio described herein is merely used as an example, but is not intended to limit the present invention. For example, if the reflectivity changes due to different thicknesses of the first bridge structure 144 and the second bridge structure 164 or due to changes of materials of the first bridge structure 144 and the second bridge structure 164, the first specific ratio also changes. It should be understood that a person of ordinary skill in the art can make appropriate modifications or replacements according to actual requirements without departing from the spirit and scope of this disclosure, as long as a difference between the average reflectivity of the portion framed by the outer edge OB1 of the first overlapping projection OA1 per unit area and the average reflectivity of the remaining non-overlapping portion of the touch panel 100A per unit area is decreased, and a visual effect of the portion framed by the outer edge OB1 of the first overlapping projection OA1 is prevented from being obvious. For example, in this embodiment, when the difference between the average reflectivity of the portion framed by the outer edge OB1 of the first overlapping projection OA1 per unit area and the average reflectivity of the remaining non-overlapping portion of the touch panel 100A per unit area is less than 3.25%, the visual effect of the portion framed by the outer edge OB1 of the first overlapping projection OA1 is prevented from being obvious, but the present invention is not limited thereto.

FIG. 4A is a top perspective view of a portion of a touch panel 200A according to still another embodiment of the present invention. FIG. 4B is a top perspective view of a portion of a touch panel 200B according to yet another embodiment of the present invention. In FIG. 4A and FIG. 4B, a portion with a pattern of dots and a portion with a pattern of oblique lines may separately represent the first bridge structure 144 and the second bridge structure 164. As shown in FIG. 4A and FIG. 4B, the first bridge structure 144 may have a first opening 146 (for example, a scope framed by a large dashed line box at an intersection of the first bridge structure 144 and the second bridge structure 164), a portion, extending into the first opening 146, of the insulating layer 180 may have a second opening 182 (for example, a scope framed by a small dashed line box) in the first opening 146, and a portion, extending into the second opening 182, of the second bridge structure 164 may have a third opening 166 (for example, a scope framed by a solid line box in the small dashed line box) in the second opening 182. That is, no first bridge structure 144, no second bridge structure 164, and no insulating layer 180 are provided in the third opening 166.

The first opening 146, the second opening 182, and the third opening 166 in the touch panel 200A, 200B are all located at an overlapping portion of the first bridge structure 144, the insulating layer 180, and the second bridge structure 164. Therefore, the average reflectivity of the overlapping portion per unit area may decrease with decreases in coverage areas of the first bridge structure 144, the second bridge structure 164, and the insulating layer 180, thereby decreasing a difference between the reflectivity of the overlapping portion and that of a remaining non-overlapping portion of the adjacent second bridge structure 164 and/or that of the first sensing pads 142 and/or that of the second sensing pads 162. In this way, when light separately passes through the overlapping portion of the first bridge structure 144, the insulating layer 180, and the second bridge structure 164 and the remaining non-overlapping portion of the touch panel 200A, 200B, the reflectivity of the overlapping portion is relatively close to the reflectivity of the remaining non-overlapping portion, so that the overlapping portion on the touch panel 200A, 200B is prevented from being visually obvious, thereby reducing or preventing visual obtrusiveness on the touch panel 200A, 200B caused by the overlapping portion.

Figure 4:
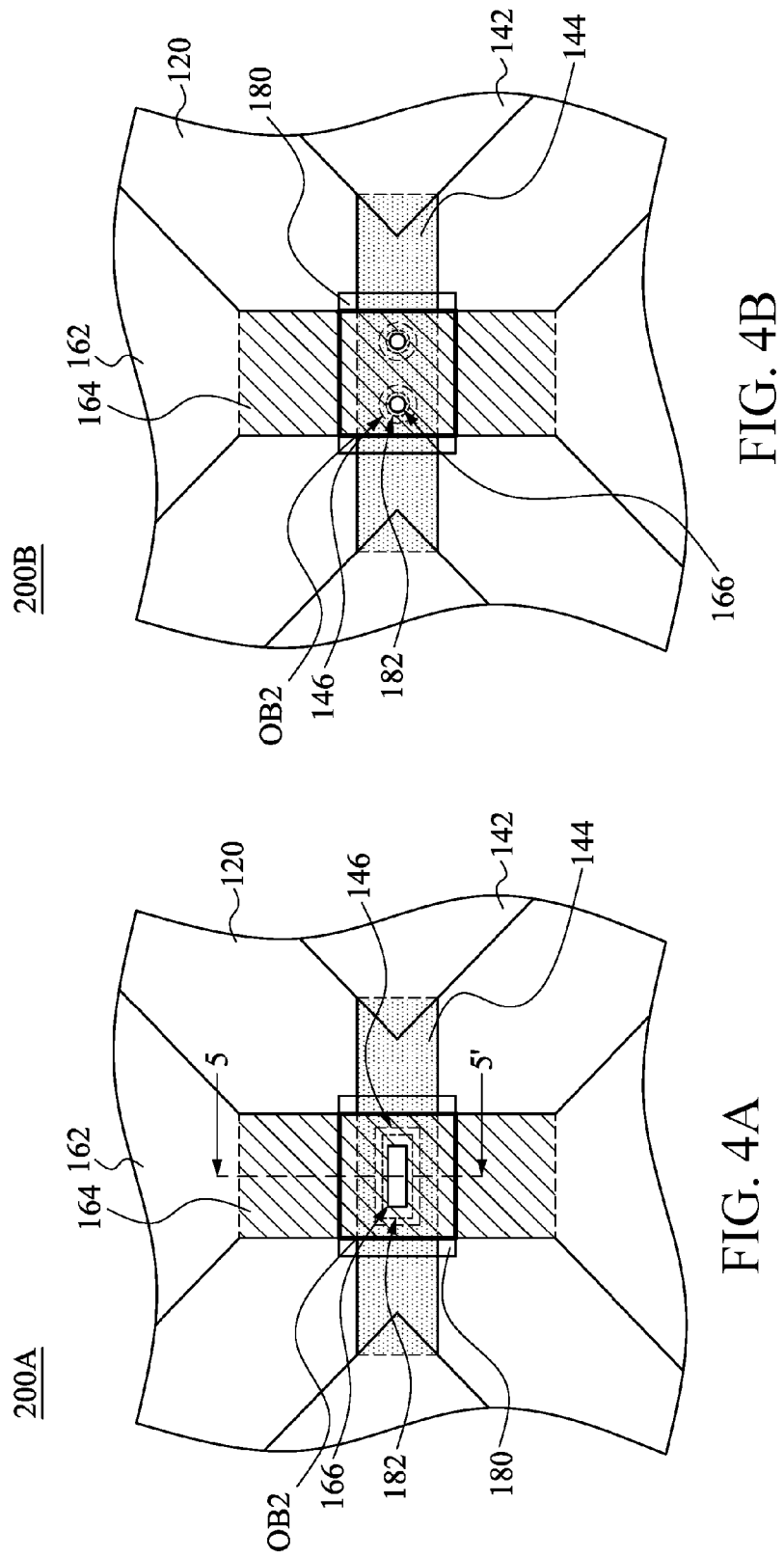
FIG. 4A is a top perspective view of a portion of a touch panel according to still another embodiment of the present invention.
FIG. 4B is a top perspective view of a portion of a touch panel according to yet another embodiment of the present invention.
Figure 5:
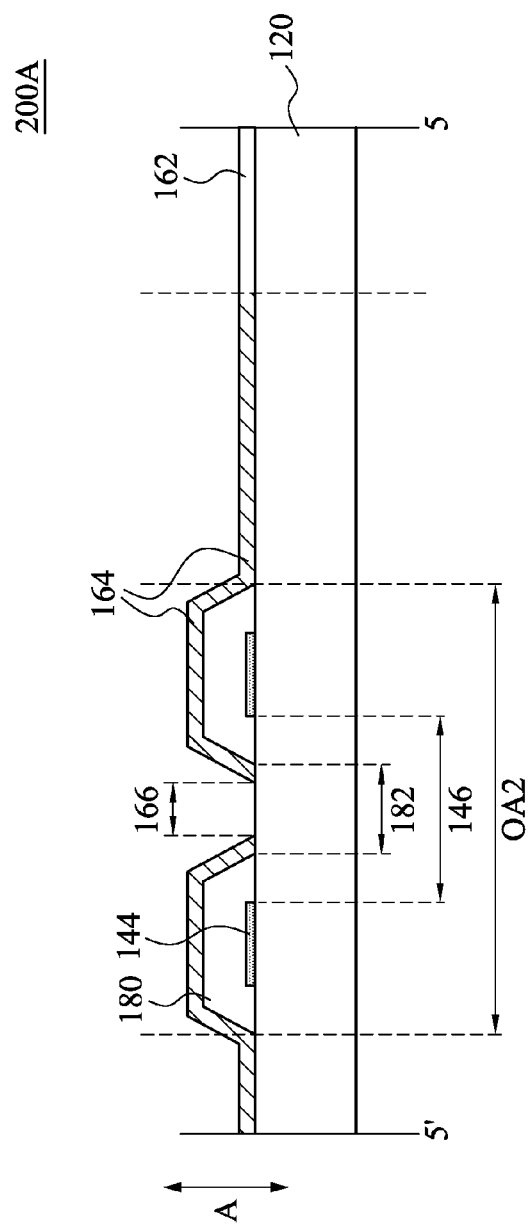
FIG. 5 is a cross-sectional view of the touch panel according to FIG. 4A taking along a line 5-5'.

FIG. 5 is a cross-sectional side view of the touch panel 200A according to FIG. 4A taking along a line 5-5'. As shown in FIG. 5, a vertical projection of the second opening 182 on the substrate 120 along the direction A vertical to the substrate 120 is greater than the third opening 166. Referring to FIG. 4A, in this embodiment, a vertical projection of the second bridge structure 164 and the insulating layer 180 on the substrate 120 along the direction A vertical to the substrate 120 overlaps a second overlapping projection OA2. That is, in FIG. 4A, a portion, overlapping the pattern of the oblique lines, of the insulating layer 180 may be the second overlapping projection OA2. In this embodiment, when a value of an area of the second overlapping projection OA2 is $A_{OA2}$, and a value of an area of the vertical projection of the third opening 166 on the substrate 120 along the direction A is Ac, an actual ratio (that is, $Ac/A_{OA2}$) between the area of the third opening 166 on the substrate 120 along the direction A (that is, Ac) and the area of the portion framed by the outer edge OB2 (referring to FIG. 4A) of the second overlapping projection OA2 (that is, $A_{OA2}$) is greater than or equal to a second specific ratio. For example, when the thickness of the first bridge structure 144 is 550 Å, and the thickness of the second bridge structure 164 is 1500 Å, the second specific ratio may be about 32.5%, but the present invention is not limited thereto, as described below in detail. It should be noted that the second specific ratio described herein is merely used as an example, but is not intended to limit the present invention. For example, if the reflectivity changes due to different thicknesses of the first bridge structure 144 and the second bridge structure 164 or due to changes of materials of the first bridge structure 144 and the second bridge structure 164, the second specific ratio also changes. It should be understood that a person of ordinary skill in the art can make appropriate modifications or replacements according to actual requirements without departing from the spirit and scope of this disclosure, as long as a difference between the average reflectivity of the portion framed by the outer edge OB2 of the second overlapping projection OA2 per unit area and the average reflectivity of the remaining non-overlapping portion of the touch panel 200A per unit area is decreased, and a visual effect displayed by the portion framed by the outer edge OB2 of the second overlapping projection OA2 is prevented from being obvious. For example, in this embodiment, when the difference between the average reflectivity of the portion framed by the outer edge OB2 of the second overlapping projection OA2 per unit area and the average reflectivity of the remaining non-overlapping portion of the touch panel 200A per unit area is less than 3.25%, the visual effect displayed by the portion framed by the outer edge OB2 of the second overlapping projection OA2 is prevented from being obvious, but the present invention is not limited thereto.

Figure 6:
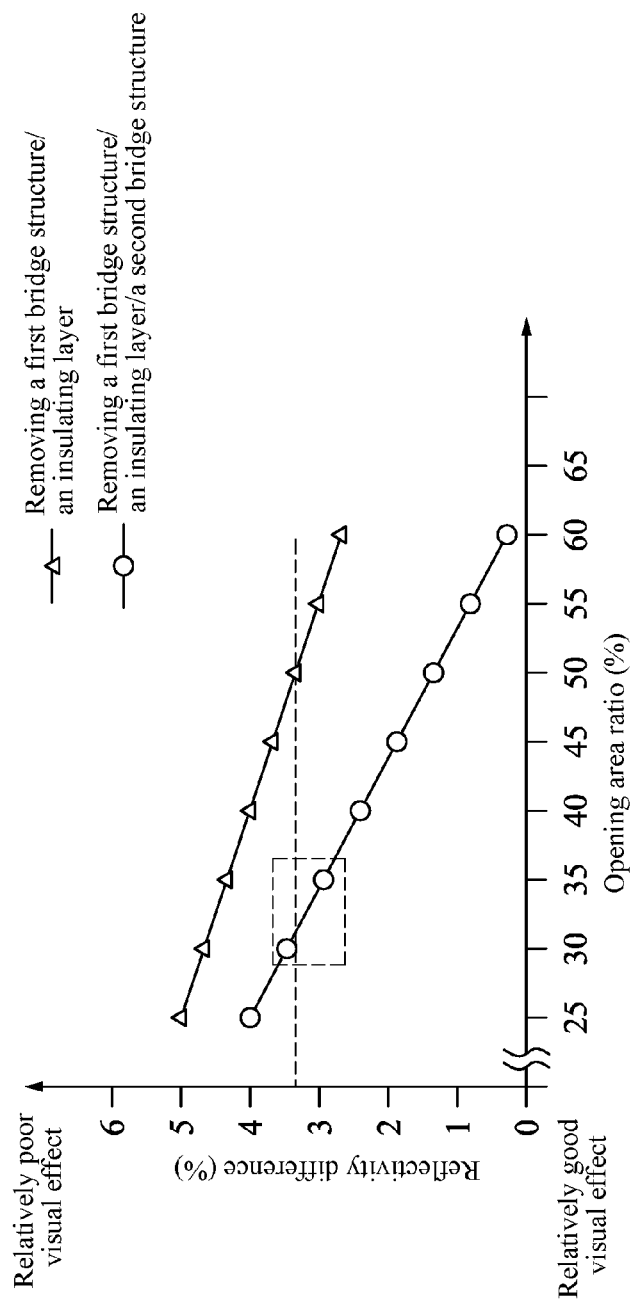
FIG. 6 is a diagram of a relationship between an opening area ratio and a reflectivity difference according to the plurality of embodiments of FIG. 3 to FIG. 5.

FIG. 6 is a diagram of a relationship between an opening area ratio and a reflectivity difference according to the plurality of embodiments of FIG. 3 to FIG. 5. The horizontal axis represents a ratio, in the unit of percentage, of an area of an opening to the area of the portion framed by the outer edge OB1 of the first overlapping projection OA1 or the outer edge OB2 of the second overlapping projection OA2. The longitudinal axis represents the difference, in the unit of percentage, between the average reflectivity of the portion framed by the outer edge OB1 of the first overlapping projection OA1 or the outer edge OB2 of the second overlapping projection OA2 per unit area to the reflectivity of the remaining non-overlapping portion of the first sensing pads, the second sensing pads, and the second bridge structure 164. A dashed line parallel to the horizontal axis indicates that when the reflectivity difference is less than or equal to 3.25%, the visual effect is relatively good. That is, when the overlapping portion of the first bridge structure 144, the insulating layer 180, and the second bridge structure 164 is not visually obtrusive in an obvious manner as compared with the remaining non-overlapping portion of the touch panel 100A or the touch panel 200A, the reflectivity difference is less than or equal to 3.25%, but the present invention is not limited thereto. For example, the reflectivity difference may change with a change in background brightness and the like of the touch panel 100A or the touch panel 200A.

As shown in FIG. 6, a straight line with triangular data points may indicate an embodiment in which the first bridge structure 144 is removed from the first opening 146 and the insulating layer 180 is removed from the second opening 182. For example, the touch panel 100A in FIG. 3. However, a condition shown in the relationship diagram is that the thickness of the first bridge structure 144 is 550 Å, the thickness of the second bridge structure 164 is 1500 Å, and the opening area ratio of the second opening 182 to the first overlapping projection OA1 is changed from 25% to 60%. It can be known from FIG. 6 that under this condition, when the opening area ratio is greater than or equal to 50%, the reflectivity difference may be less than or equal to 3.25%, thereby generating a relatively good visual effect. In this way, the first specific ratio under this condition may be about 50%. However, if the thicknesses of the first bridge structure 144 and the second bridge structure 164 are changed, the first specific ratio may be another appropriate value, and a person of ordinary skill in the art can make appropriate modifications or replacements according to actual requirements without departing from the spirit and scope of this disclosure.

As shown in FIG. 6, a straight line with circular data points may represent an embodiment in which the first bridge structure 144 and the insulating layer 180 are removed from the second opening 182, and the second bridge structure 164 is removed from the third opening 166. For example, the touch panel 200A in FIG. 5. However, a condition shown in the relationship diagram is that the thickness of the first bridge structure 144 is 550 Å, the thickness of the second bridge structure 164 is 1500 Å, and the ratio of the area of the third opening 166 to the area of the portion framed by the outer edge of the second overlapping projection OA2 is changed from 25% to 60%. It can be known from FIG. 6 that under this condition, when the opening area ratio of the third opening 166 is greater than or equal to 32.5%, the reflectivity difference may be less than or equal to 3.25%, thereby generating a relatively good visual effect. In this way, the second specific ratio under this condition may be about 32.5%. However, if the thicknesses of the first bridge structure 144 and the second bridge structure 164 are changed, the second specific ratio may be another appropriate value, and a person of ordinary skill in the art can make appropriate modifications or replacements according to actual requirements without departing from the spirit and scope of this disclosure.

Figure 7:
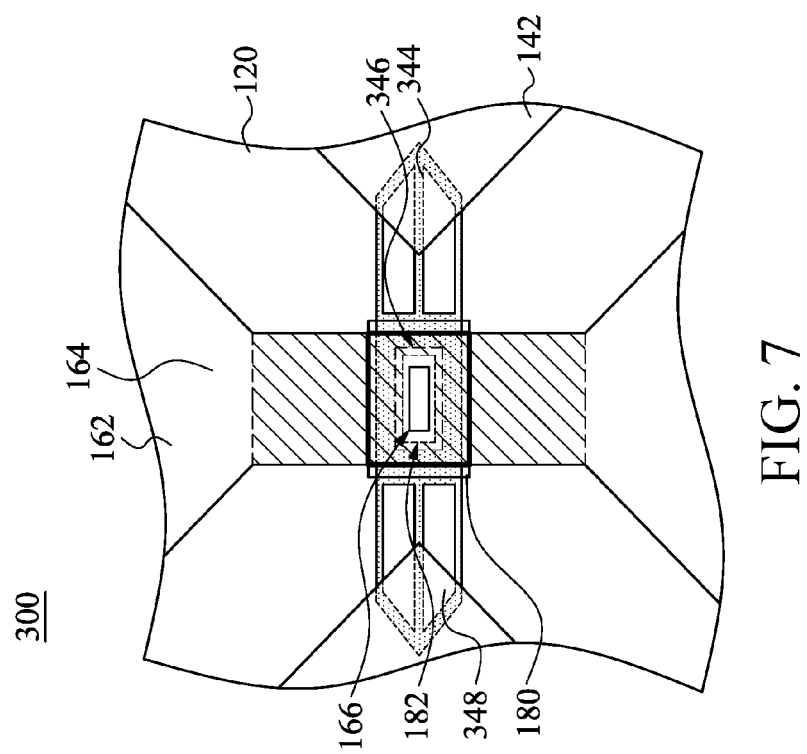
FIG. 7 is a top perspective view of a portion of a touch panel according to still yet another embodiment of the present invention.

FIG. 7 is a top perspective view of a portion of a touch panel 300 according to yet another embodiment of the present invention. As shown in FIG. 7, in this embodiment, a first bridge structure 344 may include at least one fourth opening 348. The fourth opening 348 is disposed at a portion, extending between the second bridge structure 164 and the first sensing pad 142, of the first bridge structure 344, that is, a portion, not overlapping the second bridge structure 164, of the first bridge structure 344, thereby reducing a difference between the reflectivity of the first bridge structure 344 and the reflectivity of the first sensing pad 142 or the second sensing pad 162.

To sum up, the present invention provides a touch panel, including: a substrate, a first sensing series, a second sensing series, and at least one insulating layer. The first sensing series is disposed on the substrate along a first direction. The first sensing series includes a plurality of first sensing pads and at least one first bridge structure. The first bridge structure is connected between two adjacent first sensing pads, and the first bridge structure has at least one first opening. The second sensing series is disposed on the substrate along a second direction different from the first direction. The second sensing series includes a plurality of second sensing pads and at least one second bridge structure. The second bridge structure is connected between two adjacent second sensing pads, and crosses the first bridge structure. A portion of the second bridge structure is located in the first opening of the first bridge structure. The insulating layer is disposed between the first bridge structure and the second bridge structure, where a portion, extending into the first opening, of the insulating layer has at least one second opening. Layers of an overlapping portion of a first bridge structure, a second bridge structure, and an insulating layer are respectively provided with openings corresponding to each other, such as a first opening and a second opening, and therefore, the reflectivity of the overlapping portion per unit area is decreased, a difference between the reflectivity of the overlapping portion and the reflectivity of a remaining portion of the touch panel is decreased, thereby enabling a visual effect of the overlapping portion to be not obtrusive as compared with a visual effect of the remaining portion of the touch panel. Besides, a manner of forming openings is used to decrease the reflectivity, so that first sensing pads and second sensing pads in the present invention can still transfer electrical signals through the first bridge structure and the second bridge structure separately. In this way, the touch panel has a better display effect without affecting transference paths of electrical signals of the first sensing pads and the second sensing pads, and the overlapping portion is prevented from being obtrusive caused by the reflectivity difference, thereby reducing or preventing a relatively poor visual effect caused by the overlapping portion of the first bridge structure, the second bridge structure, and the insulating layer.

Although the present invention is described above by means of the embodiments, the above description is not intended to limit the present invention. A person of ordinary skill in the art can make various variations and modifications without departing from the spirit and scope of the present invention, and therefore, the protection scope of the present invention is as defined in the appended claims.

What is claimed is:
1. A touch panel, comprising:
 a substrate;
 at least one first sensing series, disposed on the substrate along a first direction, comprising:
  a plurality of first sensing pads; and
  at least one first bridge structure, connected between any two adjacent ones of the first sensing pads, and the at least one first bridge structure having at least one first opening;
 at least one second sensing series, disposed on the substrate along a second direction different from the first direction, the at least one second sensing series comprising:
  a plurality of second sensing pads; and
  at least one second bridge structure, connected between any two adjacent ones of the second sensing pads, and crossing the at least one first bridge structure, wherein a portion of the at least one second bridge structure is located in the at least one first opening of the at least one first bridge structure; and
 at least one insulating layer, disposed between the at least one first bridge structure and the second bridge struc- ture, wherein a portion of the at least one insulating layer extending into the at least one first opening has at least one second opening, wherein the portion of the at least one second bridge structure located in the at least one first opening covers the at least one second opening, and the at least one first bridge structure and the at least one insulating layer are not provided between the portion of the at least one second bridge structure located in the at least one second opening and the substrate.

2. The touch panel according to claim 1, wherein an area of a vertical projection of each of the at least one first opening on the substrate is greater than an area of a vertical projection of each of the at least one second opening along a vertical direction to the substrate.

3. The touch panel according to claim 1, wherein a thickness of each of the first sensing pads, a thickness of each of the second sensing pads, and a thickness of each of the at least one second bridge structure are substantially same.

4. The touch panel according to claim 1, wherein a thickness of each of the at least one second bridge structure is greater than a thickness of the at least one first bridge structure.

5. The touch panel according to claim 4, wherein the thickness of each of the at least one first bridge structure is between 300 Å and 900 Å.

6. The touch panel according to claim 4, wherein the thickness of each of the at least one second bridge structure is between 1000 Å and 1600 Å.

7. The touch panel according to claim 1, wherein a vertical projection of the at least one second bridge structure and the at least one insulating layer on the substrate along a vertical direction to the substrate is a first overlapping projection, and an actual ratio of an area of a vertical projection of the at least one second opening on the substrate to an area of the first overlapping projection along the vertical direction is greater than or equal to 50%.

8. The touch panel according to claim 1, wherein the portion of the at least one second bridge structure located in the at least one first opening covers the at least one second opening and has at least one third opening, and an area of a vertical projection of the at least one second opening on the substrate along a vertical direction to the substrate is greater than an area of a vertical projection of the at least one third opening.

9. The touch panel according to claim 8, wherein a vertical projection of the at least one second bridge structure and the at least one insulating layer on the substrate along the vertical direction to the substrate is a second overlapping projection, and an actual ratio of the area of the vertical projection of the at least one third opening on the substrate to an area of the second overlapping projection along the vertical direction is greater than or equal to 32.5%.

10. The touch panel according to claim 1, wherein the at least one first bridge structure comprises at least one fourth opening, the at least one fourth opening being located at a portion between the first sensing pads and an overlapping portion of the at least one first bridge structure and the at least one second bridge structure.

* * * * *